(12) United States Patent
Kito

(10) Patent No.: US 7,192,843 B2
(45) Date of Patent: Mar. 20, 2007

(54) METHOD OF FABRICATING SEMICONDUCTOR DEVICE

(75) Inventor: Takayuki Kito, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 8 days.

(21) Appl. No.: 10/259,404

(22) Filed: Sep. 30, 2002

(65) Prior Publication Data

US 2003/0073263 A1    Apr. 17, 2003

(30) Foreign Application Priority Data

Oct. 2, 2001    (JP) .............................. 2001-306587

(51) Int. Cl.
  *H01L 21/30*    (2006.01)
(52) U.S. Cl. .................. 438/458; 438/462; 438/464
(58) Field of Classification Search .................. 438/68, 438/113, 114, 458, 462, 464, FOR. 386, 118, 438/463; 156/379.8
See application file for complete search history.

(56) References Cited

U.S. PATENT DOCUMENTS

| | | | |
|---|---|---|---|
| 5,534,102 A * | 7/1996 | Kadono et al. ............. | 156/250 |
| 5,605,844 A * | 2/1997 | Oki et al. ...................... | 438/17 |
| 5,641,714 A * | 6/1997 | Yamanaka ................... | 438/14 |
| 5,827,394 A * | 10/1998 | Lu ............................... | 156/344 |
| 6,176,966 B1 * | 1/2001 | Tsujimoto et al. .......... | 156/344 |
| 6,204,092 B1 * | 3/2001 | Freund et al. .............. | 438/113 |
| 6,215,194 B1 * | 4/2001 | Nakabayashi ............... | 257/782 |
| 6,297,131 B1 * | 10/2001 | Yamada et al. ............. | 438/464 |
| 6,311,391 B1 * | 11/2001 | Fuke et al. .................... | 29/740 |
| 6,319,754 B1 * | 11/2001 | Wang et al. ................. | 438/113 |
| 6,425,971 B1 * | 7/2002 | Silverbrook ................ | 156/230 |
| 6,461,942 B2 * | 10/2002 | Watanabe et al. ........... | 438/464 |
| 6,558,975 B2 * | 5/2003 | Sugino et al. ................ | 438/64 |
| 6,589,809 B1 * | 7/2003 | Koopmans ................... | 438/68 |
| 6,629,553 B2 * | 10/2003 | Odashima et al. .......... | 156/584 |

FOREIGN PATENT DOCUMENTS

| | | |
|---|---|---|
| JP | 59-205733 | 11/1984 |
| JP | 01-80935 | 5/1989 |
| JP | 08-222587 | 8/1996 |
| JP | 09-8102 | 1/1997 |

* cited by examiner

*Primary Examiner*—Matthew Smith
*Assistant Examiner*—Khiem Nguyen
(74) *Attorney, Agent, or Firm*—Rabin & Berdo, PC

(57) ABSTRACT

The present invention is a method of fabricating a semiconductor device by transferring a semiconductor chip supported on a flexible support film to a mount member by means of a robot arm. This method comprises a film bending step of bending a support film so that same has a pickup face that lies along the movement direction of the robot arm and a withdrawal face that lies substantially perpendicular to this movement direction and does not interfere with the robot arm; a step of disposing the mount member, whereon the semiconductor chip is to be mounted, in a position facing the withdrawal face and flanking on the pickup face; and a step of picking up the semiconductor chip from the pickup face by means of the robot arm and transferring the semiconductor chip to the mount member.

17 Claims, 4 Drawing Sheets

METHOD OF FABRICATING SEMICONDUCTOR DEVICE

BACKGROUND OF THE INVENTION

1. Field of the Invention

The present invention relates to a method of fabricating a semiconductor device by mounting a semiconductor chip on a mount member such as a lead frame, and more particularly relates to a method of fabricating a semiconductor device comprising a small semiconductor chip such as a small signal transistor.

2. Description of the Related Art

In a process for fabricating a semiconductor device, a multiplicity of semiconductor chip is cut from a single semiconductor wafer, and individual semiconductor chips are moved to and mounted on a mount member such as a lead frame.

FIGS. 6(a), 6(b) and 6(c) are illustrative views to illustrate a conventional method of fabricating a semiconductor device.

A semiconductor wafer 32 is bonded to and supported at the center of an adhesive and extensible expanding tape 31. Semiconductor chips 33 are obtained by cutting the semiconductor wafer 32 in this condition (FIG. 6(a)).

The expanding tape 31 is then extended through lateral stretching. Individual semiconductor chips 33 are thus separated from one another. The distribution region 37 of the semiconductor chips 33 is then larger in size than the semiconductor wafer 32 prior to cutting. A lead frame 36, which is a mount member whereon the semiconductor chips 33 are to be mounted, is disposed alongside the expanding tape 31 (FIG. 6(b)).

The semiconductor chip 33 to be transferred is then pushed upward from below the expanding tape 31 by a pin 34 and the semiconductor chip 33 is moved upward while being attracted by an adsorption collet 35, such that the semiconductor chip 33 is separated from the expanding tape 31. The adsorption collet 35 is then moved horizontally (as indicated by the arrow C in FIG. 6) to thereby move the semiconductor chip 33 to a position above the lead frame 36. The adsorption collet 35 is then lowered to thus mount the semiconductor chip 33 in a predetermined location on the lead frame 36 (FIG. 6(c)).

The average horizontal movement distance L6 of the semiconductor chip 33 from a position on the expanding tape 31 to a position on the lead frame 36 is half or more than half the width of the expanding tape 31. The adsorption collet 35, having completed the mounting of the semiconductor chip 33 on the lead frame 36, must then move to a position above the semiconductor chip 33 which is to be mounted next, by returning substantially the same distance.

Further, in cases where small semiconductor chips 33 are cut from a large semiconductor wafer 32, the total number of semiconductor chips 33 is enormous. For example, when semiconductor chips 33 which are 0.35 mm square are cut from a 6-inch semiconductor wafer 32, the semiconductor chips 33 number approximately 140,000. Further, the average horizontal movement distance L6 of the semiconductor chip 33 increases in accordance with an increase in the size of the semiconductor wafer 32 and of the distribution region 37 of the semiconductor chip 33. Here, according to the method of fabricating a semiconductor device described above, the time required for the movement of the adsorption collet is also substantial. Consequently, the time required to fabricate the semiconductor device is long and the productivity is not necessarily favorable.

SUMMARY OF THE INVENTION

It is an object of the present invention to provide a method of fabricating a semiconductor device which makes it possible to raise the productivity of semiconductor devices.

The method of the present invention is a method of fabricating a semiconductor device by transferring a semiconductor chip supported on a flexible support film to a mount member by means of a robot arm that moves in a predetermined movement direction. This method comprises a film bending step of bending a support film so that same has a pickup face that lies along the movement direction and a withdrawal face that lies substantially perpendicular to the movement direction and does not interfere with the robot arm; a step of disposing the mount member, whereon the semiconductor chip is to be mounted, in a position facing the withdrawal face and flanking on the pickup face; and a chip mounting step of picking up the semiconductor chip from the pickup face by means of the robot arm and of transferring the semiconductor chip to the mount member.

The support film may be an adhesive and extensible expanding tape, for example. In this case, the film bending step can also be carried out after the expanding tape is extended and the semiconductor chips are separated from one another once semiconductor chips have been obtained by cutting the semiconductor wafer with same bonded to and supported on the expanding tape.

The withdrawal face of the support film thus bent by means of the film bending step is substantially perpendicular to the pickup face. It is therefore possible to dispose the mount member (lead frame, for example) alongside the pickup face so that the mount member does not interfere with the support film and lies in the vicinity of the pickup face. Therefore, in the chip mounting step, the distance through which the robot arm moves in order to transfer the semiconductor chip from the pickup face to the mount member is short.

Because a change to the position at which the support film is bent brings about a change in the position of the pickup face in the support film, even if the semiconductor chip is bonded and supported within the support film, the semiconductor chip can be disposed so as to lie in the vicinity of the mount member. In other words, the distance between the semiconductor chip on the pickup face and the mount member is neither dependent on the magnitude of the wafer diameter nor on the magnitude of the distribution region of the semiconductor chip 33.

Accordingly, the time required for the robot arm to transfer the semiconductor chip is short. This permits a shortening of the time required to fabricate a semiconductor device and raises the productivity thereof. More particularly, in cases where it is necessary to transfer a multiplicity of semiconductor chips, same being obtained by cutting small semiconductor chips from a large semiconductor wafer, to the mount member, the fabrication time is markedly reduced.

The support film can be bent by applying an auxiliary bending member to the no-chip-mount face of the support film. In this case, the bend position of the support film can be changed by moving at least one of the support film and the auxiliary bending member to cause relative motion between the support film and the auxiliary bending member.

Mounting of the semiconductor chip on the mount member can involve die bonding using an electrically conductive paste, for example.

Mounting of the semiconductor chip on the mount member can be performed repeatedly until semiconductor chips are no longer present in the section of the pickup face which lies in the vicinity of the mount member. Thereafter, the bend position of the support film is moved (shifted) to make it possible to dispose another semiconductor chip in a position in the vicinity of the mount member. All of the semiconductor chips on the support film can thus be transferred to the mount member by means of a short movement distance.

The film bending step described above preferably comprises a step of bending the support film at an angle of 90° or more.

It is possible to bend the support film at an angle of 90° or more in total (180°, for example) by providing one, or two or more bent portions in addition to the bent portion between the pickup face and the withdrawal face. It is thus possible to freely set the positioning and the like of the mount member that faces the pickup face.

In cases where the support film is bent at two or more points and the pickup face is formed so as to have a uniform width, the width of the pickup face is preferably made short in comparison with the distribution region width of the semiconductor chip, and can, for example, be on the order of a width that corresponds to between one and ten semiconductor chips. When the support film is made to bend acutely below the semiconductor chip and the pickup face is extremely narrow, the lower face of the semiconductor chip is then separated from the support film in the vicinity of both edges of the semiconductor chip. The semiconductor chip can therefore be separated from the support film in a straightforward manner.

The above-described object, characteristics and effects of the present invention, or other objects, characteristics and effects thereof will become evident by means of the following description of the embodiments by way of reference to the attached drawings.

DESCRIPTION OF THE PREFERRED EMBODIMENTS

Figure 1:
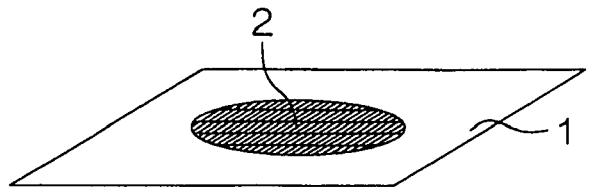
FIG. 1(a), FIG. 1(b), and FIG. 1(c) are illustrative perspective views that serve to illustrate the method of fabricating a semiconductor device according to a first embodiment of the present invention.
Figure 1:
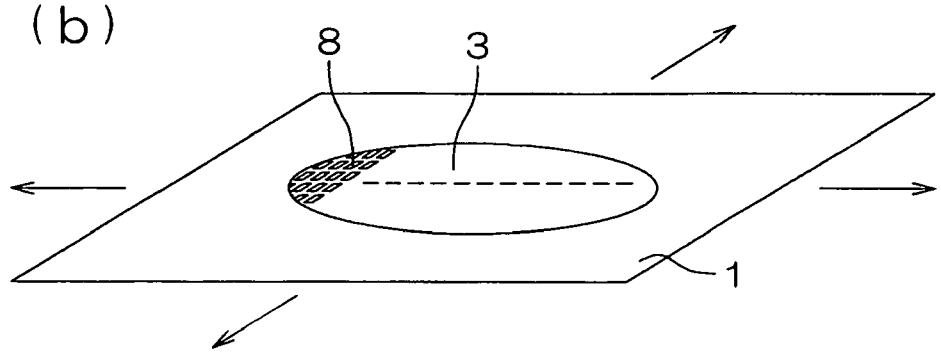
Figure 1:
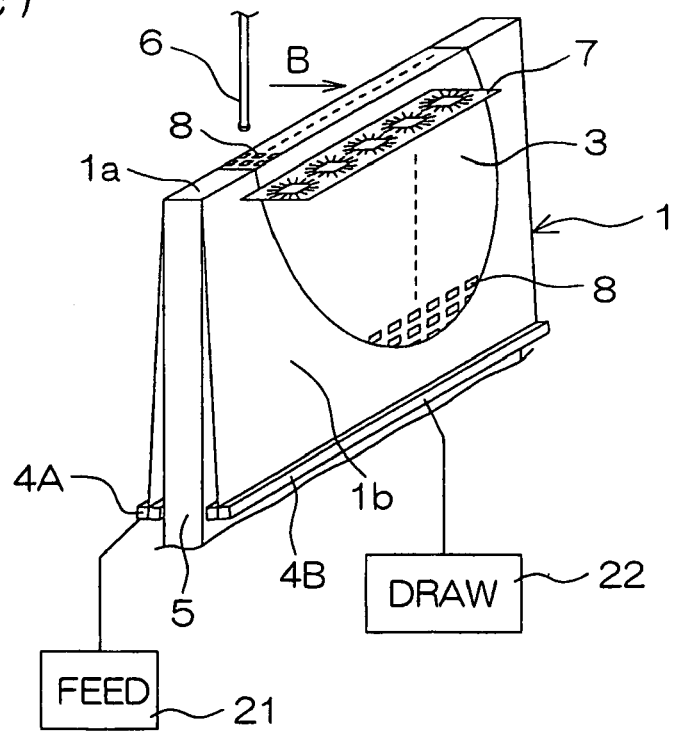

FIG. 1(a), FIG. 1(b), and FIG. 1(c) are illustrative perspective views that serve to illustrate the method of fabricating a semiconductor device according to the first embodiment of the present invention.

First of all, a semiconductor wafer 2 which has undergone a step of forming a variety of elements and a wiring step, and the like, is bonded to and supported on a chip mount face that constitutes one side of a substantially square expanding tape 1 which is flexible, adhesive and extensible. When the semiconductor wafer 2 is large (having a diameter of six inches or more, for example), it is difficult to handle all at once. As such, a semiconductor wafer 2 cut to one quarter of the size can also be bonded and supported thus, for example. Regions on the wafer 2 corresponding to semiconductor chips are arranged in the form of a matrix to follow the edges of the expanding tape 1.

The semiconductor wafer 2 is then cut using a dicing saw in the direction of the edges of the expanding tape 1 (FIG. 1(a)). Here, areas of the expanding tape 1 which lie close to the surface thereof may also be cut at the same time.

The expanding tape 1 is then extended by stretching the four edges thereof outward. This makes it possible to obtain individual pieces constituting semiconductor chips 8 that are bonded to and supported by the expanding tape 1 and that are separated from one another (FIG. 1(b)). The distribution region 3 of the semiconductor chips 8 on the expanding tape 1 is large in comparison with the size of the semiconductor wafer 2 prior to cutting. Because the expanding tape 1 does not shrink to its original size once the same has been extended, even if the force applied to stretch the expanding tape 1 is no longer applied, the individual pieces constituting the semiconductor chips 8 remain separated from one another.

Rod-like fixing members 4A and 4B are then fixed to a pair of opposing edges of the expanding tape 1. A plate-like auxiliary bending plate 5 which is disposed vertically and whose upper end face forms a long and narrow horizontal plane is then applied to the no-chip-mount face of the expanding tape 1 (the face on the opposite side from the chip mount face). The expanding tape 1 is thus bent such that the chip mount face is on the outside and the no-chip-mount face is on the inside. The fixing members 4A and 4B are disposed so as to lie in the vicinity of the auxiliary bending plate 5 on both sides thereof.

The first fixing member 4A is linked to a feed mechanism 21, while the second fixing member 4B is linked to a draw mechanism 22. The feed mechanism 21 and draw mechanism 22 are capable of pulling the expanding tape 1 downward. Consequently, the expanding tape 1 is subjected to a tensile force between the upper end of the auxiliary bending plate 5 and the fixing member 4A, and between the upper end of the auxiliary bending plate 5 and the fixing member 4B respectively. Furthermore, the feed mechanism 21 is capable of moving upward so as to let out the expanding tape 1, and the draw mechanism 22 is capable of moving downward so as to draw the expanding tape 1. It is thus possible to displace the relative position of the expanding tape 1 with respect to the auxiliary bending plate 5.

Figure 3:
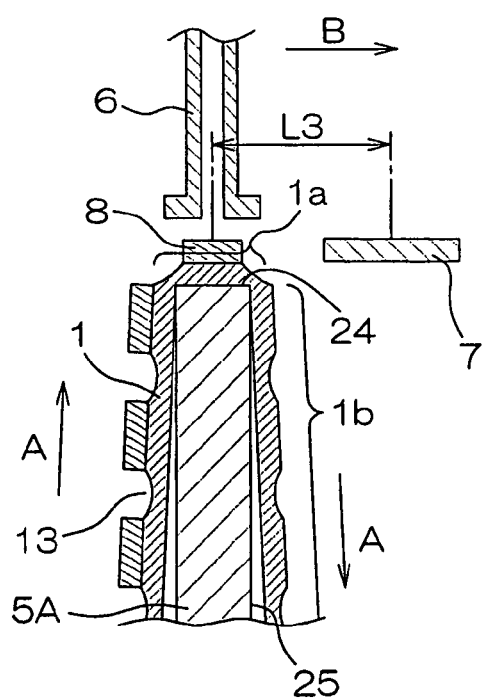
FIG. 3 is an illustrative cross-sectional view showing a modified example of the auxiliary bending plate of FIG. 2.
Figure 5:
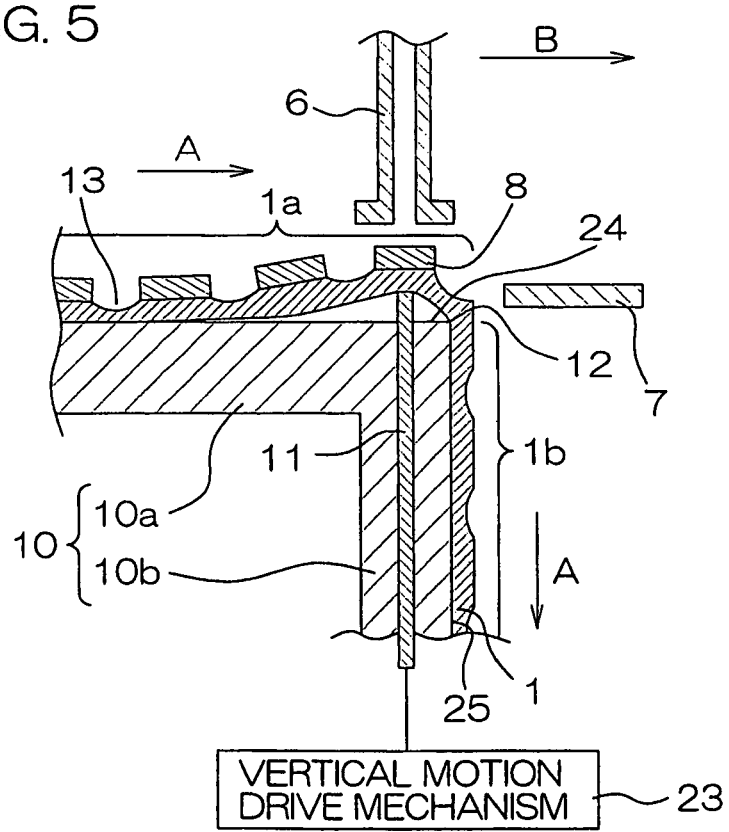
FIG. 5 is an illustrative cross-sectional view to illustrate the method of fabricating a semiconductor device according to the second embodiment of the present invention.
Figure 6:
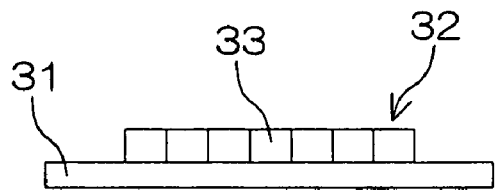
FIGS. 6(a), 6(b) and 6(c) are illustrative views to illustrate a conventional method of fabricating a semiconductor device.
Figure 6:
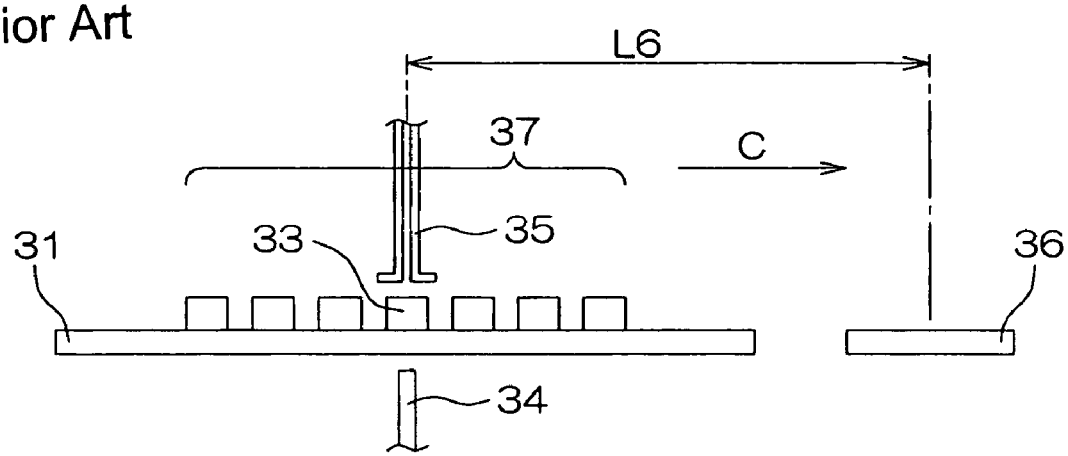
Figure 6:
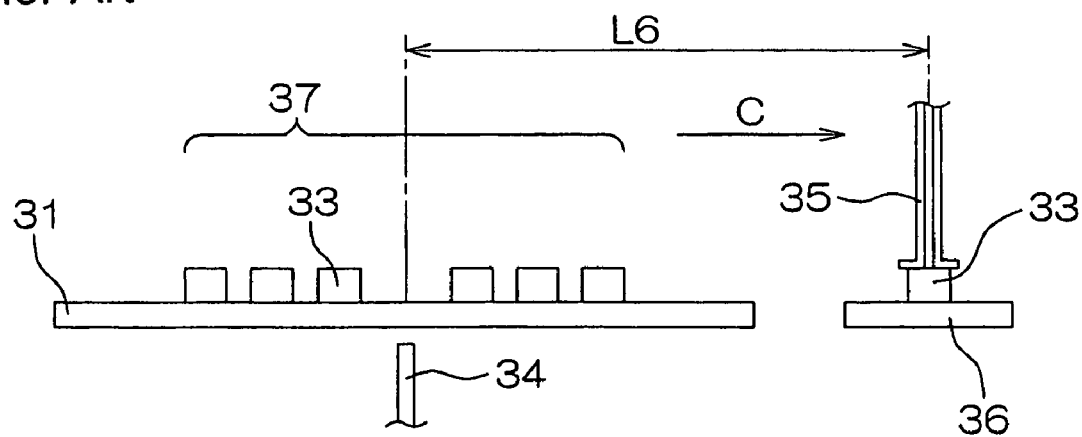

FIG. 1(c) shows that the pickup face 1a and the withdrawal face 1b are both substantially flat, and that they form a substantially L-shaped surface, and several rows of chips 8. Fig. 3 shows the pickup face 1a limited to a width that can accommodate exactly one row of the semiconductor chips 8, and the withdrawal face 1b not being limited to the width of exactly one row of the semiconductor chips 8. FIG. 1(c) shows that the auxiliary bending plate or member 5 has a substantially rectangular cross-sectional shape, the shape comprising a width and a length, the length being greater than the width, wherein the pickup face 1a is adjacent the width, and the withdrawal face 1b is adjacent to the length. FIG. 5 shows an auxiliary bending member which has a substantially L-shaped surface.

One of the directions in which the semiconductor wafer 2 is cut (the direction of the edges of the expanding tape 1) is set to match the longitudinal direction of the upper face of the auxiliary bending plate 5. Semiconductor chips 8 are thus disposed in rows on the upper end face of the auxiliary bending plate 5.

Subsequently, a lead frame 7, which is a mount member whereon the semiconductor chips 8 are to be mounted, is disposed alongside the upper end of the auxiliary bending plate 5. The height of the lead frame 7 is substantially the same as the height of the semiconductor chips 8 on the upper end of the auxiliary bending plate 5. This condition is shown in FIG. 1(*c*). The face of the expanding tape 1 which is on the auxiliary bending plate 5 and which is oriented in a horizontal direction is the pickup face 1*a*, and the face which faces the lead frame 7 by extending downward from the lead-frame side edge of the pickup face 1*a* is the withdrawal face 1*b*.

When a semiconductor chip 8 above the auxiliary bending plate 5 is moved upward by an adsorption collet 6 while being attracted thereto, the semiconductor chip 8 is separated from the expanding tape 1. In other words, the semiconductor chip 8 is picked up by the adsorption collet 6. The adsorption collet 6 is then moved horizontally sideward (in the direction along the pickup face 1*a*) (the direction of movement is indicated by the arrow B in FIG. 1), the semiconductor chip 8 is moved to a position above the lead frame 7, and the adsorption collet 6 is lowered to thus mount the semiconductor chip 8 in a predetermined location of the lead frame 7. Because the adsorption collet 6 moves in a predetermined direction above the pickup face 1*a*, there is no interference between the adsorption collet 6 and the expanding tape 1. Mounting of the semiconductor chip 8 on the lead frame 7 can, for example, be carried out by die bonding using an electrically conductive paste.

In such a method of fabricating a semiconductor device, the semiconductor chips 8 on the pickup face 1*a* neighbor the lead frame 7. In other words, as a result of bending the expanding tape 1 such that the withdrawal face 1*b* lies in the vertical direction, it is possible to dispose the lead frame 7 alongside the pickup face 1*a* in the vicinity thereof without the lead frame 7 interfering with the expanding tape 1. The horizontal movement distance of the semiconductor chip 8 on the pickup face 1*a* to the lead frame 7 is far shorter than the horizontal movement distance L6 according to the prior art (which is half or more than half the width of the expanding tape 31), and is not dependent on the size of the distribution region 3 of the semiconductor chips 8.

Accordingly, even when the semiconductor chips 8 are inwardly supported on the expanding tape 1, a semiconductor chip 8 can be mounted on the lead frame 7 by means of the adsorption collet 6 by being moved a short distance. That is, the time required for the transfer of the semiconductor chip 8 is short. Because a shortening of the time required for fabrication of a semiconductor device is thus possible, the productivity of the semiconductor device can be raised. In cases where it is necessary to transfer a multiplicity of semiconductor chips 8, the fabrication time is markedly reduced. More particularly, when a small semiconductor chip 8 equal to or less than 0.5 mm square, such as a small signal transistor, is cut from a large semiconductor wafer 2 whose diameter is six inches or more, the effect of reducing the fabrication time is significant.

Figure 2:
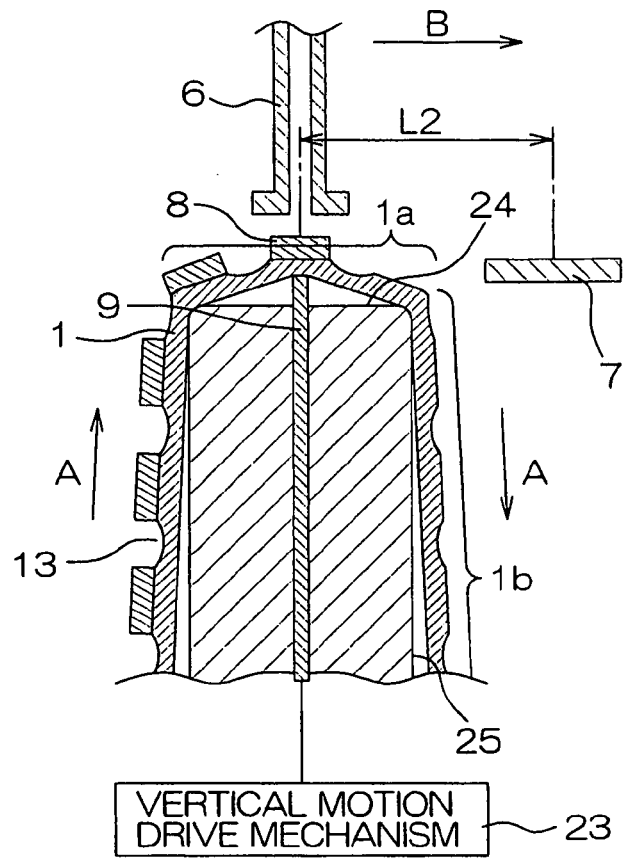
FIG. 2 is an illustrative cross-sectional view in which the constitution in the vicinity of the upper edge of an auxiliary bending plate is shown enlarged.

FIG. 2 is an illustrative cross-sectional view in which the constitution of the vicinity of the upper end of the auxiliary bending plate 5 is shown enlarged.

The auxiliary bending plate 5 has a substantially rectangular cross-sectional shape. The upper end of the auxiliary bending plate 5 is a pickup stage 24 for introducing semiconductor chips 8 to the adsorption collet 6. The side of the auxiliary bending plate 5 which faces the lead frame 7 is a tape withdrawal path forming face 25 for securing a withdrawal path for the expanding tape 1. The expanding tape 1 is bent by the auxiliary bending plate 5 by substantially 90° at two points so as to be bent overall by substantially 180°.

The expanding tape 1 comprises grooves 13 that are formed as a result of cutting the surface of the tape at the same time as cutting the semiconductor wafer 2, and when such grooves are located close to the top of the auxiliary bending plate 5, the resulting surface is the substantially horizontal pickup face 1*a*. The thickness of the auxiliary bending plate 5 and the width of the pickup face 1*a* are substantially equal. The pickup face 1*a* has a width which contains substantially three (three rows of) semiconductor chips 8. One row of semiconductor chips 8 is arranged so as to be positioned substantially at the center in the thickness direction of the auxiliary bending plate 5.

A lifting plate 9 for lifting the semiconductor chips 8 from below is provided at the center in the thickness direction of the auxiliary bending plate 5. The lifting plate 9 passes through the auxiliary bending plate 5 vertically and is raised or lowered by means of a vertical motion drive mechanism 23. Consequently, the upper end of the lifting plate 9 is capable of adopting a state of being housed within the auxiliary bending plate 5 and a state of protruding from the auxiliary bending plate 5 (FIG. 2 shows a state in which the upper end of the lifting plate 9 protrudes from the auxiliary bending plate 5). In a state in which a semiconductor chip 8 has been lifted by the lifting plate 9, the semiconductor chip 8 can be easily separated from the expanding tape 1 and picked up therefrom by moving the semiconductor chip 8 upward by means of the adsorption collet 6 while the semiconductor chip 8 is attracted thereto.

It is therefore possible to sequentially transfer, onto the lead frame 7, semiconductor chips 8 that are disposed at the center in the thickness direction of the auxiliary bending plate 5. A lead frame 7 which has already had a semiconductor chip 8 (normally a plurality thereof) mounted thereon is made to withdraw from the chip mount position, and in place of this lead frame 7, another lead frame 7 that has no chips mounted thereon is guided to the chip mount position.

When the mounting of all of the semiconductor chips 8 disposed at the center in the thickness direction of the auxiliary bending plate 5 is complete, the expanding tape 1 is displaced (the movement direction is indicated by the arrow A in FIG. 2) by the feed mechanism 21 and the draw mechanism 22 (see FIG. 1(*c*)). The next row of semiconductor chips 8 is thus located at the center in the thickness direction of the auxiliary bending plate 5. When the expanding tape 1 is shifted, the tensile force acting on the expanding tape 1 may be relaxed.

Similarly thereafter, the semiconductor chips 8 can be moved to and mounted on the lead frame 7. By producing sequential relative motion of the expanding tape 1 with respect to the auxiliary bending plate 5 from one end of the distribution region 3 to the other, all of the semiconductor chips 8 on the expanding tape 1 can be transferred.

FIG. 3 is an illustrative cross-sectional view showing a modified example of the auxiliary bending plate 5 of FIG. 2.

This auxiliary bending plate 5A is substantially rectangular in cross section, and the thickness of the auxiliary bending plate 5A and the thickness of the pickup face 1*a* are substantially equal. Further, the thickness of the auxiliary bending plate 5A is substantially equal to the thickness of one semiconductor chip 8. In other words, only one semiconductor chip 8 (one row thereof) can be disposed on the pickup face 1a at the same time. The thickness of the semiconductor chip 8 and that of the auxiliary bending plate 5A correspond to the width of the semiconductor chip 8 and are set at 0.5 mm or less, for example. By using such an auxiliary bending plate 5A of reduced thickness, it is possible to further reduce the interval between the semiconductor chip 8 to be moved and the lead frame 7. In other words, the horizontal movement distance L3 of the semiconductor chip 8 as shown in FIG. 3 is shorter than the horizontal movement distance L2 of the semiconductor chip 8 as shown in FIG. 2.

Furthermore, the auxiliary bending plate 5A is not provided with the lifting plate 9 which the auxiliary bending plate 5 shown in FIG. 2 comprises. Such a constitution is possible when the adsorption collet 6 possesses adequate adsorptive power.

Figure 4:
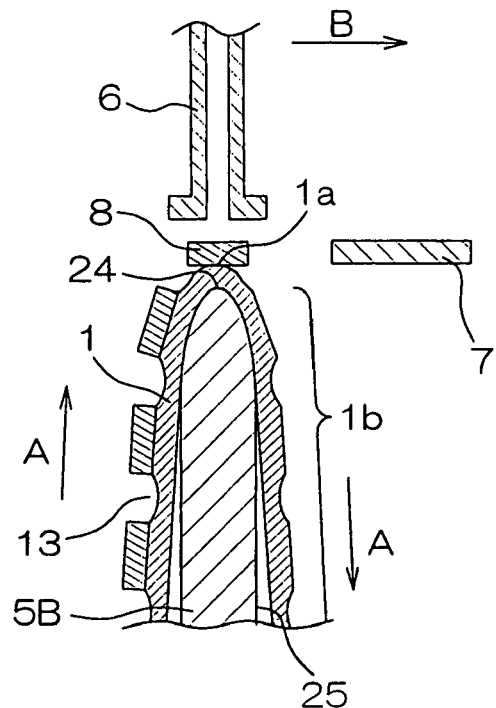
FIG. 4 is an illustrative cross-sectional view showing another modified example of the auxiliary bending plate of FIG. 2.

FIG. 4 is an illustrative cross-sectional view showing another modified example of the auxiliary bending plate 5 of FIG. 2.

Like the auxiliary bending plate 5A shown in FIG. 3, this auxiliary bending plate 5B has the same degree of thickness as the width of the semiconductor chip 8. The cross-sectional shape of the upper end of the auxiliary bending plate 5B is a half ellipse, projecting upwards. Using such an auxiliary bending plate 5B causes the expanding tape 1 to bend with a small radius of curvature locally at the upper end of the auxiliary bending plate 5B. As a result, the expanding tape 1 is detached in the vicinity of both sides of the lower face of the semiconductor chip 8. The semiconductor chip 8 is therefore easily adsorbed by the adsorption collet 6 and easily detached from the expanding tape 1. Here, the surface of contact between the expanding tape 1 and the semiconductor chip 8 is the pickup face 1a.

In the embodiment above, the lead frame 7 is disposed on only one side of the pickup face 1a but a lead frame 7 can also be disposed on both sides of the pickup face 1a. Here, while a lead frame 7 on one side of the pickup face 1a, which has already had semiconductor chips 8 mounted thereon, is being substituted for a lead frame 7 having no chips mounted thereon, it is possible to mount semiconductor chips 8 on the lead frame 7 on the other side of the pickup face 1a. The fabrication time can thus be reduced.

FIG. 5 is an illustrative cross-sectional view to illustrate the method of fabricating a semiconductor device according to the second embodiment of the present invention. Those parts of constituent elements that are the same as the constituent elements shown in FIG. 1 have been assigned the same reference numerals and a description thereof is omitted here.

Fabrication steps are carried out that are like those of the fabrication method according to the first embodiment of the present invention as far as the steps of extending the expanding tape 1 (see FIG. 1(b)) and of fixing a pair of opposing edges of the expanding tape 1 by means of fixing members (an illustration thereof is omitted in FIG. 5). Thereafter, the expanding tape 1 is placed extendedly, such that the expanding tape 1 bends at an angle of 90°, by using a corner 12 of an auxiliary bending member 10 whose horizontal plate-like portion 10a and vertical plate-like portion 10b, the latter being suspended from one end of the former, form the corner 12. The face of the expanding tape 1 which follows the horizontal plate-like portion 10a is the pickup face 1a, and the tape face which follows the vertical plate-like portion 10b is the withdrawal face 10b. The width of the pickup face 1a is equal to the width of the expanding tape 1 on the horizontal plate-like portion 10a.

One of the directions in which the semiconductor wafer 2 is cut (the direction of the edges of the expanding tape 1) is set to match the longitudinal direction of the plate-like portion 10b (the direction in FIG. 5 which lies perpendicular to the paper). As a result, the semiconductor chips 8 are arranged so as to form a row in a direction that is oriented in the longitudinal direction of the plate-like portion 10b. The lead frame 7 is then disposed alongside the corner 12 so as to lie in the vicinity of the corner 12.

A lifting plate 11, which is for lifting a semiconductor chip 8 at the center in the thickness direction of the plate-like portion 10b from below, is provided at the upper end of the vertical plate-like portion 10b (in the vicinity of the end of the horizontal plate-like portion 10a). The upper end of the lifting plate 11 adopts a state of being housed within the vertical plate-like portion 10b and a state of protruding from the vertical plate-like portion 10b (FIG. 5 shows the upper end of the lifting plate 11 protruding from the vertical plate-like portion 10b).

One row of semiconductor chips 8 is arranged so as to be positioned substantially at the center in the thickness direction of the plate-like portion 10b. These semiconductor chips 8 can then be detached and picked up from the expanding tape 1 by adsorbing the semiconductor chip 8 which is to be transferred by means of the adsorption collet 6 while lifting up the lifting plate 11 from below this semiconductor chip 8. The adsorption collet 6 is then moved horizontally sideward to thereby move the semiconductor chip 8 to a position above the lead frame 7. The adsorption collet 6 is then lowered to mount the semiconductor chip 8 in a predetermined location on the lead frame 7. Thereafter, similarly to the first embodiment, semiconductor chips 8 can be transferred in sequence to the lead frame 7.

According to the present embodiment, a semiconductor chip 8 is picked up by the adsorption collet 6 at a fixed position in the vicinity of that end of the pickup face 1a which is on the withdrawal face 1b side. Accordingly, even when the pickup face 1a is extremely large in relation to the width of the semiconductor chip 8, the semiconductor chip 8 to be moved and the lead frame 7 can be arranged so as to adequately approach one another. In this embodiment too, the horizontal movement distance of the semiconductor chip 8 is neither dependent on the width of the distribution region 3 of the semiconductor chips 8 nor on the width of the expanding tape 1.

In this embodiment also, when the adsorption collet 6 possesses adequate adsorptive power, it is possible to dispense with the lifting plate 11 and the semiconductor chips 8 can be detached from the expanding tape 1 without being lifted from below.

The angle of curvature of the expanding tape 1 as a whole is not limited to substantially 180° or 90°, but rather can be set arbitrarily so long as the lead frame 7 can be disposed in the vicinity of the pickup face 1a so as to not interfere with the expanding tape 1. The mount member whereon the semiconductor chips 8 are mounted is not limited to the lead frame 7 but rather may be a wiring substrate or similar produced by applying wiring to an insulator.

Furthermore, the movement of the expanding tape 1 may also be implemented, after both ends of the expanding tape 1 have been wound around the fixing members 4A and 4B which constitute spindles, by letting off the expanding tape 1 from one fixing member 4A (4B) while the expanding tape 1 is wound up on the other fixing member 4B (4A). Here, the feed mechanism 21 and the draw mechanism 22 can be adapted to control the rotation of the fixing members 4A and 4B which are spindles.

A detailed description of embodiments of the present invention has been provided but such embodiments are merely specific examples used to clarify the technological purport of the present invention. The present invention should not be interpreted as being limited to or by these specific examples, the spirit and scope of the present invention being limited only by the scope of the attached claims.

This application claims benefit of Japanese Application No. 2001-306587 filed in Japan on Oct. 2, 2001, the contents of which are incorporated by this reference.

What is claimed is:

1. A method of fabricating a semiconductor device by transferring a semiconductor chip supported on a flexible support film to a mount member by means of a robot arm that moves in a predetermined movement direction that is substantially parallel to a contact surface defined by a surface of the semiconductor chip, at least a portion of which surface is in contact with the support film; the method comprising:
   a film bending step of bending the support film so that same has a pickup face that lies along the movement direction and a withdrawal face that lies substantially perpendicular to the movement direction and does not interfere with the robot arm;
   a step of disposing the mount member, whereon the semiconductor chip is to be mounted, in a position facing the withdrawal face and flanking on the pickup face;
   a step of lifting the semiconductor chip supported on the support film by a lifting member, from a side of the support film opposite from the semiconductor chip; and
   a chip mounting step of picking up the semiconductor chip lifted by the lifting member from the pickup face by means of the robot arm and of moving the semiconductor chip in the predetermined movement direction to transfer the semiconductor chip to the mount member.

2. The method as claimed in claim 1, wherein the film bending step comprises a step of bending the support film at an angle of 90° or more.

3. The method as claimed in claim 1, wherein the support film is adhesive and extensible expanding tape, and the method further comprises: a step of obtaining semiconductor chips by cutting a semiconductor wafer with same bonded to and supported on the expanding tape; and a step of extending the expanding tape so that the semiconductor chips are then separated from one another, these steps being undertaken prior to the film bending step.

4. The method as claimed in claim 1, wherein the film bending step comprises a step of applying an auxiliary bending member to the no-chip-mount withdrawal face of the support film, and the method further comprises a step of changing the position at which the support film is bent by moving at least one of the support film and the auxiliary bending member to cause relative motion between the support film and the auxiliary bending member.

5. The method as claimed in claim 1, wherein the film bending step comprises a step of bending the support film such that a part of the lower face of the semiconductor chip on the pickup face is then detached from the support film.

6. The method as claimed in claim 4, wherein the lifting member passes through the bending member.

7. The method as claimed in claim 1, wherein the pickup face and the withdrawal face are both substantially flat.

8. The method as claimed in claim 7, wherein the withdrawal face and the pickup face comprise a substantially L-shaped surface.

9. The method as claimed in claim 7, wherein the pickup face is limited to a width that can accomodate exactly one row of the semiconductor chips, and the withdrawal face is not limited to the width of exactly one row of the semiconductor chips.

10. The method as claimed in claim 4, wherein the auxiliary bending member has a substantially rectangular cross-sectional shape, the shape comprising a width and a length, the width being wide enough to accomodate exactly one row of the semiconductor chips, and a length that is greater than the width; and wherein the pickup face is adjacent the width, and the withdrawal face is adjacent to the length.

11. The method as claimed in claim 4, wherein the auxiliary bending member has a substantially L-shaped surface.

12. A method of fabricating a semiconductor device, comprising:
    disposing a plurality of semiconductor chips on a flexible support film;
    providing a bending member having a pickup stage, and a face that extends downward from the pickup stage;
    positioning the flexible support film over the bending member, so that at least one of the semiconductor chips is disposed over the pickup stage;
    bending the flexible support film so that a first portion of the flexible support film is disposed over the face of the bending member, and a second portion of the flexible support film having the at least one of the semiconductor chips disposed thereon is positioned over the pickup stage, with the second portion being essentially perpendicular to the first portion;
    a step of lifting the semiconductor chip supported on the support film by a lifting member, from a side of the support film opposite from the semiconductor chip;
    transferring the at least one of the semiconductor chips lifted by the lifting member from the second portion of the flexible support film to a mount member; and
    after said transferring, moving said flexible support film so that the second portion is disposed over the face of the bending member, and a third portion of the flexible support film having at least another one of the semiconductor chips disposed thereon is positioned over the pickup stage.

13. The method as claimed in claim 12, wherein the lifting member passes through the bending member.

14. The method as claimed in claim 12, wherein the face and the pickup stage are both substantially flat.

15. The method as claimed in claim 14, wherein the face and the pickup stage comprise a substantially L-shaped surface.

16. The method as claimed in claim 15, wherein the pickup stage is limited to a width that can accomodate exactly one row of the semiconductor chips, and the face is not limited to the width of exactly one row of the semiconductor chips.

17. The method as claimed in claim 16, wherein the bending member has a substantially rectangular cross-sectional shape.

* * * * *